Oct. 26, 1965 B. GETTYS 3,213,667
METHODS OF TESTING JOINTS BETWEEN THERMOELECTRIC ELEMENTS AND JUNCTION MEMBERS
Filed Dec. 11, 1963
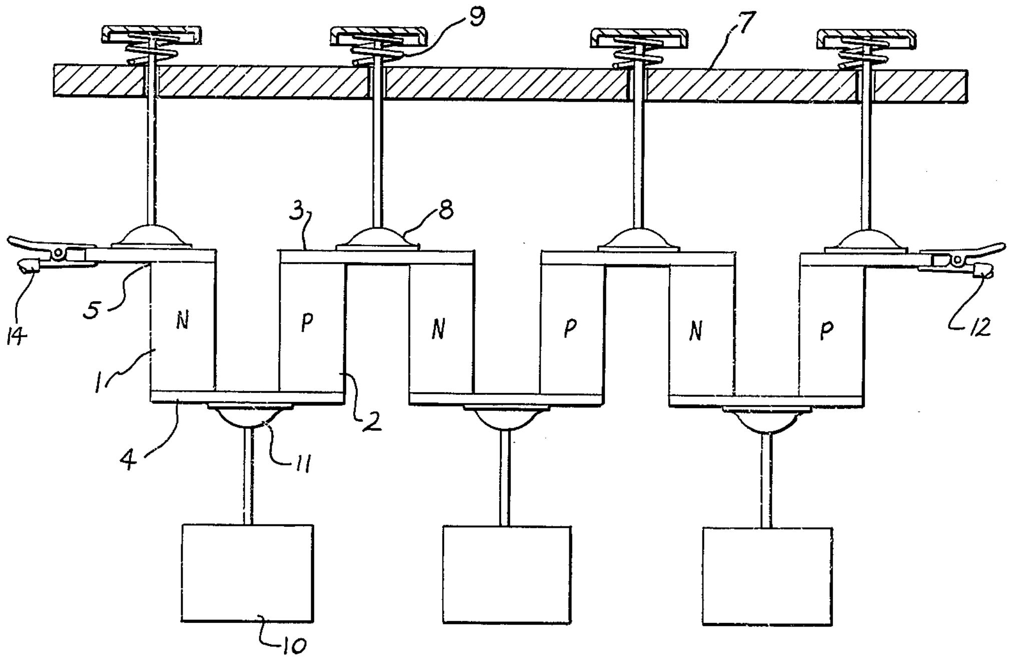
INVENTOR.
BRIGGS GETTYS
BY Walter E. Kule
HIS ATTORNEY United States Patent Office 3,213,667
Patented Oct. 26, 1965

3,213,667
METHODS OF TESTING JOINTS BETWEEN THERMOELECTRIC ELEMENTS AND JUNCTION MEMBERS

Briggs Gettys, Louisville, Ky., assignor to General Electric Company, a corporation of New York
Filed Dec. 11, 1963, Ser. No. 329,706
2 Claims. (Cl. 73—15.4)

The present invention relates to an improved method of testing the quality, or more particularly the resistivity of a solder joint between a thermoelectric element and a junction member.

Thermoelectric units normally comprise pairs of dissimilar thermoelectric elements, that is P-type and N-type elements, alternately and series-connected so that when a direct current is passed through the series-connected elements there is produced a set of cold junctions and a set of hot junctions. In accordance with the usual practice, junction members, in the form of sheets or strips of copper, aluminum or other good electrically and heat conducting material soldered to the spaced dissimilar elements have been employed to connect these elements.

In one type of well known thermoelectric unit, the thermoelectric elements having dissimilar thermoelectric properties are P-type and N-type bismuth telluride elements and the joints between these elements and the junction members comprise bismuth, bismuth-tin or tin-lead base alloys.

It is well known that the electrical and mechanical properties of the soldered joints have a substantial effect on the life and performance of thermoelectric units. A high electrical resistance at the cold junction reduces the figure of merit of the individual thermocouples while a high junction resistance at the hot junction increases the power which has to be dissipated by the hot junction. This power increase in turn increases the hot junction temperature and by conduction of heat through the individual elements indirectly increases the cold junction temperature.

Imperfect joints or in other words joints having abnormal resistivity values may result either from the fact that the soldering alloy has not completely wet one or the other of the opposed joint surfaces, generally the thermoelectric element surface, or the fact that the soldered joint includes high resistance impurities which markedly decrease the conductivity of the joint. Since an abnormally high joint resistance may reduce the cooling effect produced by a thermoelectric couple as much as 30 to 40% below the theoretical maximum value, it is highly desirable that some simple and reliable means be provided for determining the quality of the soldered joint or joints in a thermoelectric unit before that unit is put into use.

One well known method of testing any soldered joint comprises subjecting the joint to tension forces sufficient to mechanically break an imperfect joint without damaging an acceptable joint. Such a test cannot satisfactorily be applied to the testing of thermoelectric unit joints. While the tensile test may disclose a grossly imperfect joint there is no correlation between the mechanical and electrical properties of the joint. In other words a joint which passes the tensile test may nevertheless have an unacceptably high electrical resistivity.

The most commonly used method for appraising the electrical resistivity of a joint in a thermoelectric unit is the so-called scan method. In that method the thermoelectric element is cast in epoxy resin and is then polished along a longitudinal flat section or sections to expose the semi-conductor and the joint or joints. A current is passed through the sample and measurements are repeatedly made of the potential distribution along the sample. As the test probe is moved along the themoelectric element a poor joint is indicated by a step increase in the resistivity. By this method, each joint must be individually tested. Thus the operation is slow and totally unsuited for quality control or rapid appraisal of all of the joints in thermoelectric molecule.

The present invention has as its primary object the provision of an improved process for testing the quality of soldered joints in a thermoelectric module, which test is non-destructive as to any acceptable joints.

A further object of the invention is to provide a test process by means of which all of the soldered joints in a thermoelectric unit can be simultaneously and quickly tested.

Further objects and advantages of the present invention will become apparent as the following description proceeds and the features of novelty which characterize the invention will be pointed out with particularity in the claims annexed to and forming part of this specification.

The present invention is based on the discovery that even though the soldered joint between a thermoelectric element and a junction member has a substantially lower resisitivity than the thermoelectric element, such a joint or all of the soldered joints in an assembly of thermocouples can be quickly tested by a process which comprises applying to each of the joints to be tested a tension force less than the tensile strength of the thermoelectric element and thereafter passing a current pulse of high magnitude and short duration through the joints with the result that the soldered portion of an imperfect joint will melt and be broken by the tension force while an acceptable joint will not be affected by the heat momentarily generated in the joint area. While current pulses of various magnitudes and durations may be satisfactorily employed, it is highly desirable to keep the duration of the pulse short enough so that there is little if any flow of heat from the joint area into other parts of the assembly and the magnitude of the pulse many times that of the normal operating current of the thermoelectric unit, preferably from 30 or more times the normal operating current. Either an alternating current or direct current pulse can be employed.

For a better understanding of the invention reference may be had to the accompanying drawing in which the single figure is a schematic illustration of suitable test equipment which may be employed in the practice of the present invention.

With reference to the accompanying drawing, the illustrated test equipment is designed to be employed for simultaneously testing all of the joints in a thermoelectric module comprising a plurality of thermocouples each of which consists of a P-type and N-type element. More specifically such a module, as is somewhat schematically illustrated in the accompanying drawing, includes a plurality of dissimilar N and P-type thermoelectric elements arranged in pairs and having their one ends connected by means of junction members 3 and their other ends connected by junction members 4 to form a plurality of thermocouples in which the junction members 3 form either hot or cold junctions and the members 4 form the opposite junctions.

In accordance with the usual practice the ends of the elements 1 and 2 are joined to the junction members 3 and 4 by soldered joints 5. When a direct current is passed through the module or unit so that for example the junction members 4 form hot or heat dissipating junctions and the members 3 form cold or cooling junctions, heat will be absorbed by the junctions 3 and dissipated at the junctions 4.

The thermoelectric properties of the individual thermocouples and the unit as a whole are dependent primarily upon the thermoelectric properties of the respective elements 1 and 2 forming the individual couples however any resistance heat generated within the thermocouple during the passage of current plays an important role in the over-all performance of the thermocouple and, as has been previously indicated, any junction resistance in the joints 5 results in additional heat which must be dissipated at the heat dissipating junction and in effect decreases the cooling effect of the cold junction. Thus the quality of the soldered joints 5 between the elements 1 and 2 and the junction members 3 and 4 has a marked effect on the over-all performance of each thermocouple.

The quality testing process of the present invention is designed to provide a quality control test for each of the soldered joints in a thermoelectric module which will not harm or damage good soldered joints but which will reveal joints having abnormally high resistivities. The test equipment employed for carrying out this quality test essentially comprises means for placing each of the joints 5 under tension and means for passing a current pulse through each of the joints of a magnitude and duration such that imperfect joints will melt and open during the test procedure while acceptable joints will not be affected by the test.

With reference to the drawing, the illustrated test equipment comprises a base 7 on which a plurality of vacuum cups 8 are supported by means of springs 9. The vacuum cups 8 are designed to be attached to each of the junction members 3 on one side of the module while the springs 9 are designed to distribute the load and assure that the module will be supported on the base 7 through each of the thermocouples. Suitable weights 10 are secured by means of vacuum cups 11 to each of the junction members 4 on the opposite side of the module with the result that each of the soldered joints 5 in the module is subjected to a tension force approximately equal to one-half the mass of each of the weights 10. The weights 10 need only exert a significant tension force on the joints 5 without unduly straining the junction members or the elements 1 and 2 and to this end it has been found sufficient to employ weights of the order of about one-one hundredth the tensile strength of the semi-conductor elements 1 and 2.

While such a tension force is applied to each of the joints 5, a current of high magnitude and short duration is passed through the entire module by connecting the opposite ends of the module to a suitable current source through the leads 12 and 14. The current is of a magnitude and duration such that the heat generated in each of the joints 5 due to the $I^2R$ loss will cause the joint or joints which are imperfect to melt and to part under the load 10. The pulse duration is kept short so that the major portions of the heat produced is restricted to any high resistivity joint and does not flow into other parts of the module.

The magnitude and duration of the current are chosen so that a joint of a given area will either break or remain intact depending upon its quality. In other words, the watts-second product of the test pulse should be such that any imperfect joints will be broken before there is any substantial migration of heat into the material adjacent the areas of acceptable joints which could result in deterioration of the properties of the thermoelectric material even though the joints are otherwise.

Ordinarily the current will be at least 10 times the current normally passed to the thermoelectric module during normal operation thereof. For example, modules in which the thermoelectric elements and hence the joints 5 had a diameter of 5 millimeters, and which normally operated at 20 amperes was tested by passing a current of 1000 amperes through the module for 20 milliseconds, or in other words to about 50 amperes per square millimeter of maximum joint area. In general a current pulse having a magnitude of 40 to 60 times the current normally passed through the joint will give best results while the total duration of the pulse should not exceed one-half second and ordinarily will be substantially less.

The operation of the process of the present invention can best be understood by considering the fact that a module is simply an assembly of alternate junction members of copper, aluminum, silver or the like which are excellent conductors of heat and electricity and semi-conductor elements, such as bismuth telluride or the like, which are poor heat conductors and also poorer conductors of electricity than copper by several orders of magnitude. These components are joined together by thin films of solder which is a good heat conductor but is intermediate between the junction members and the semi-conductors in electrical conductivity. In an acceptable soldered joint the resistivity of the joint is generally about 2% and at least less than 5% of the resistivity of the semi-conductor. However, in a poor solder joint, the solder film has failed to wet and coat one or both surfaces, usually the semi-conductor surface. This incomplete wetting which cannot readily and quickly be detected by prior test methods, manifests itself by areas on the face of the semi-conductor which are free of solder or by a solder layer having a high resistivity film between the solder layer and the semi-conductor.

In the use of the present process, the Joule heating of the joint is represented by $I^2R$ and in transient or short duration conditions the current I is the current density over the conductive area of the joint. A reduction in the effective joint area thus increases the heating effect as the square of the current. Therefore, a poor joint as for example one having one one-half of the joint area effectively bridged by solder will be subjected to twice the current density and four times the heating effect as a good joint. By selecting a current pulse of the proper magnitude and duration which will not unduly heat acceptable joints, it will be obvious that the unacceptable joints can be determined without adversely affecting the acceptable joints.

After subjecting a module to the quality test, any poor joints will be evident either by visual observation of the module or if this is not possible, the module may be connected to a normal source of current in which case any poor joint will cause an open circuit. There is thus provided means for testing a module prior to incorporation into a thermoelectric device with the assurance that any module which has passed the test is characterized by soldered joints of acceptable quality.

While the invention has been described with reference to a particular test equipment, it will be understood that various modifications may be made without departing from the spirit of the invention and it is therefore intended by the appended claims to cover all such modifications as fall within the scope of the invention.

What I claim as new and desire to secure by Letters Patent of the United States is:

1. The process of testing the quality of a soldered joint between a thermoelectric element and a junction member which comprises:

applying to said joint a tension force less than the tensile strength of said element, passing a current pulse through said element and member of a magnitude and duration such that the soldered portion of an imperfect joint will melt and be broken by said force while an acceptable joint will not be affected by the heat generated therein.

2. The process of claim 1 in which the current pulse is from 40 to 60 times the current passed through said joint during normal operation of a thermoelectric module including said joint and the duration of said pulse is less than one-half second.

References Cited by the Examiner

UNITED STATES PATENTS 341,289 5/86 Temple -------------- 200—117

RICHARD C. QUEISSER, *Primary Examiner.*

DAVID SCHONBERG, *Examiner.*